(12) United States Patent
Shao et al.

(10) Patent No.: US 9,864,222 B2
(45) Date of Patent: *Jan. 9, 2018

(54) CURVED DISPLAY PANEL, CURVED DISPLAY PANEL DEVICE AND METHOD FOR FABRICATING THE SAME

(71) Applicants: Boe Technology Group Co., Ltd., Beijing (CN); Beijing Boe Display Technology Co., Ltd., Beijing (CN)

(72) Inventors: Xibin Shao, Beijing (CN); Yingying Qu, Beijing (CN); Honglin Zhang, Beijing (CN); Hebin Zhao, Beijing (CN); Seungmin Lee, Beijing (CN); Dan Wang, Beijing (CN); Xiang Li, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 44 days.

This patent is subject to a terminal disclaimer.

(21) Appl. No.: 14/777,837

(22) PCT Filed: Apr. 17, 2015

(86) PCT No.: PCT/CN2015/076881
§ 371 (c)(1),
(2) Date: Sep. 17, 2015

(87) PCT Pub. No.: WO2016/070583
PCT Pub. Date: May 12, 2016

(65) Prior Publication Data
US 2016/0320657 A1    Nov. 3, 2016

(30) Foreign Application Priority Data

Nov. 3, 2014 (CN) .......................... 2014 1 0610592

(51) Int. Cl.
*G09G 3/36* (2006.01)
*G02F 1/1333* (2006.01)
(Continued)

(52) U.S. Cl.
CPC ........ *G02F 1/133308* (2013.01); *G09F 9/301* (2013.01); *H05K 7/1417* (2013.01);
(Continued)

(58) Field of Classification Search
CPC .. G09F 9/301; G02F 1/1333; G02F 1/133305; G02F 1/133308;
(Continued)

(56) References Cited

U.S. PATENT DOCUMENTS 5,273,475 A * 12/1993 Oshikawa ......... G02F 1/133305
156/163
7,190,503 B2 * 3/2007 Ide ........................ G02F 1/1333
349/58

(Continued)

FOREIGN PATENT DOCUMENTS

| CN | 101344651 A * | 1/2009 | ....... G02F 1/133308 |
| CN | 101963718 | 2/2011 | |

(Continued)

OTHER PUBLICATIONS

International Search Report and Written Opinion from PCT/CN15/076881 dated Jul. 20, 2015.
(Continued)

*Primary Examiner* — Joe H Cheng
(74) *Attorney, Agent, or Firm* — Calfee, Halter & Griswold LLP

(57) ABSTRACT

A curved display panel, a curved display device, and a method for fabricating the same are disclosed. Both the light output face and the light input face of the curved display panel are continuously curved surfaces. The curved display
(Continued)

panel with a continuously curved surface has a bending degree which is closer to the natural bending degree of a liquid crystal panel, so that a relatively small stress is generated on the curved display panel, and the problem of serious peripheral light leakage caused by deformation of the curved display panel is alleviated. Besides, since the curvature radius of each point on the continuously curved surface changes slowly, the problem of serious peripheral light leakage caused by deformation of the curved display panel is alleviated, the complexity of the fabricating process is reduced, the fabricating process is simplified, and the production of the product is improved.

9 Claims, 2 Drawing Sheets

(51) Int. Cl.
  *G09F 9/30* (2006.01)
  *H05K 7/14* (2006.01)
(52) U.S. Cl.
  CPC ............ *G02F 2001/133314* (2013.01); *G02F 2001/133325* (2013.01); *G02F 2201/56* (2013.01)
(58) Field of Classification Search
  CPC .......... G02F 2001/133314; G02F 2001/13332; G02F 2001/133325; G02F 2001/133616; G02F 2001/1398
  See application file for complete search history.

(56) References Cited

U.S. PATENT DOCUMENTS

| | | | | |
|---|---|---|---|---|
| 7,667,786 B2* | 2/2010 | Nouchi | ................ | G02B 6/0088 349/58 |
| 7,667,891 B2* | 2/2010 | Cok | ................ | G03B 21/56 345/82 |
| 7,834,962 B2* | 11/2010 | Satake | ................ | G02F 1/133305 349/110 |
| 7,847,912 B2* | 12/2010 | Nishizawa | ................ | G02F 1/133305 349/158 |
| 8,582,209 B1* | 11/2013 | Amirparviz | ................ | G02B 3/0056 359/630 |
| 2007/0146569 A1* | 6/2007 | Nouchi | ................ | G02B 6/0088 349/58 |
| 2009/0096965 A1* | 4/2009 | Nagata | ................ | G02F 1/133305 349/103 |
| 2009/0122223 A1* | 5/2009 | Hayano | ................ | G02F 1/136209 349/58 |
| 2009/0316062 A1* | 12/2009 | Nishizawa | ................ | G02F 1/133305 349/58 |
| 2010/0033648 A1 | 2/2010 | Kaganezawa | | |
| 2010/0060604 A1* | 3/2010 | Zwart | ................ | G06F 1/1601 345/173 |
| 2010/0157577 A1* | 6/2010 | Montgomery | ................ | G02B 6/0018 362/97.2 |
| 2010/0165551 A1* | 7/2010 | Chen | ................ | G02B 1/005 361/679.01 |
| 2010/0238367 A1* | 9/2010 | Montgomery | ................ | G02B 6/005 349/15 |
| 2010/0289983 A1* | 11/2010 | Rocard | ................ | B29D 11/0074 349/62 |
| 2011/0019129 A1* | 1/2011 | Nishizawa | ................ | G02F 1/133308 349/64 |
| 2011/0193814 A1* | 8/2011 | Gay | ................ | G02B 27/2221 345/173 |
| 2012/0020056 A1* | 1/2012 | Yamagata | ................ | G02F 1/133308 362/97.1 |
| 2012/0044618 A1* | 2/2012 | Lee | ................ | 361/679.01 |
| 2012/0113368 A1* | 5/2012 | Zhang | ................ | G02F 1/133345 349/106 |
| 2012/0242588 A1* | 9/2012 | Myers | ................ | G06F 1/1637 345/173 |
| 2013/0321740 A1* | 12/2013 | An | ................ | H05K 5/0217 349/58 |
| 2014/0063434 A1* | 3/2014 | Zhao | ................ | B23B 27/00 349/158 |
| 2015/0022475 A1* | 1/2015 | Watanabe | ................ | G06F 3/041 345/173 |
| 2015/0085220 A1* | 3/2015 | Chen | ................ | G02F 1/133606 349/62 |
| 2015/0145755 A1* | 5/2015 | Yamazaki | ................ | G09G 3/32 345/76 |
| 2015/0160509 A1* | 6/2015 | Lee | ................ | G02F 1/133528 349/42 |
| 2015/0253493 A1* | 9/2015 | Tsai | ................ | G02B 6/0045 349/58 |
| 2015/0256658 A1* | 9/2015 | Shin | ................ | G06F 1/1637 455/566 |
| 2015/0378188 A1* | 12/2015 | Moon | ................ | G02F 1/1333 349/65 |
| 2016/0026035 A1* | 1/2016 | Nagaoka | ................ | G02F 1/133512 349/110 |
| 2016/0054614 A1* | 2/2016 | Choi | ................ | G02F 1/133308 349/58 |
| 2016/0077384 A1* | 3/2016 | Yang | ................ | G02F 1/133723 349/128 |
| 2016/0291384 A1* | 10/2016 | Shao | ................ | G02F 1/133308 |
| 2016/0309598 A1* | 10/2016 | Yamaguchi | ................ | G09F 9/30 |

FOREIGN PATENT DOCUMENTS

| | | |
|---|---|---|
| CN | 103777382 | 5/2014 |
| CN | 103852937 | 6/2014 |
| CN | 103953893 | 7/2014 |
| CN | 104282235 | 1/2015 |
| CN | 104299525 | 1/2015 |
| CN | 2024229763 | 3/2015 |
| CN | 204242528 | 4/2015 |
| JP | 2008309813 | 12/2008 |
| JP | 2009093000 A * | 4/2009 |

OTHER PUBLICATIONS

Office action from Chinese Application No. 201410610592.9 dated May 5, 2016.
Office Action from China Application No. 201410610592.9 dated Oct. 8, 2016.
Office Action from China Application No. 20140610592.9 dated Dec. 29, 2016.
Notice of Reexamination for China Application No. 201410610592.9 dated Aug. 4, 2017.

* cited by examiner

CURVED DISPLAY PANEL, CURVED DISPLAY PANEL DEVICE AND METHOD FOR FABRICATING THE SAME

RELATED APPLICATIONS

The present application is the U.S. national phase entry of PCT/CN2015/076881, with an international filing date of Apr. 17, 2015, which claims the benefit of Chinese Patent Application No. 201410610592.9 filed Nov. 3, 2014, the entire disclosures of which are incorporated herein by reference.

FIELD OF THE INVENTION

The present disclosure relates to the field of display technology, and particularly to a curved display panel, a curved display device and a method for fabricating the same.

BACKGROUND OF THE INVENTION

The existing curved display panel like a curved surface TV has been applied widely. The curved display panel faces challenges, like complex fabricating process and dark-state light leakage (L0 light leakage). In IPS (In-Plane Switching) and ADS (Advanced Super Dimension Switching) technology, light leakage in the dark-state is relatively serious due to the effect of their own modes. Thus, OLED (Organic Light-Emitting Diode) mode or VA (Vertical Alignment) mode are usually adopted in the curved display panel. However, OLED has the drawbacks of extremely high fabricating cost, immature technology, and low yield.

Currently, curved display panels with curved surface liquid crystal screens have been developed and produced to realize liquid crystal screens of a curved surface design. However, the curved display panel has a bending shape which differs substantively from the natural bending degree of the liquid crystal panel. As a result, the curved display panel is subject to relatively larger stress and the curvature radius of each point on the curved surface changes rapidly, so that serious light leakage appears at a peripheral region of the curved display panel. Additionally, due to the shape of the curved surface of the curved display panel, the fabricating process is complex.

SUMMARY OF THE INVENTION

The present disclosure provides a curved display panel, a curved display device and a method for fabricating the same, and intends to alleviate the problem of serious peripheral light leakage in a curved display panel and reduce the complexity of the fabricating process.

In some embodiments, the present disclosure provides a curved display panel, wherein the curved display panel has a light output face and a light input face, and both the light output face and the light input face are continuously curved surfaces.

Optionally, the curved surfaces have a bending shape of an elliptic curve.

Optionally, the elliptic curve has a mathematical formula of $x^2/a^2+y^2/b^2=1$, wherein a, b are constants.

Optionally, a, b are set by by mathematical fitting according to a preset curvature radius.

Optionally, the elliptic curve has a curvature radius in a range of 4200 mm-6600 mm.

In some embodiments, the present disclosure provides a curved display device, wherein the curved display device comprises an assembling frame and the above-mentioned curved display panel which is arranged in the assembling frame.

Optionally, the assembling frame comprises a bezel and a mold frame which are configured to mount the curved display panel, a side mold frame which is configured to support a diffuser plate of a display module of the curved display device, and a back cover which is configured as a back cover of the curved display device, wherein the bezel, the mold frame, the side mold frame, and the back cover have a light output face and a light input face, both of which are continuously curved surfaces.

In some embodiments, the present disclosure provides a method for fabricating a curved display device, the method comprises steps of:

forming an assembling frame with a light output face and a light input face, both of which are continuously curved surfaces;

forming a display panel;

arranging the display panel in the assembling frame, wherein the display panel has a light output face and a light input face which are formed into continuously curved surfaces that correspond to curved surfaces of the assembling frame, thus completing a curved display panel.

Optionally, the assembling frame comprises a bezel, a mold frame, a side mold frame, and a back cover, wherein the bezel, the mold frame, the side mold frame, and the back cover have a light output face and a light input face, both of which are continuously curved surfaces.

Optionally, the curved surfaces have a bending shape of an elliptic curve.

Optionally, the elliptic curve has a mathematical formula of $x^2/a^2+y^2/b^2=1$, wherein a, b are constants.

The present disclosure has the following beneficial technical effects.

In the technical solutions of the curved display panel, the curved display device, and the method for fabricating the same of the present disclosure, both the light output face and the light input face of the curved display panel are continuously curved surfaces. The curved display panel with a continuously curved surface has a bending degree which is closer to the natural bending degree of a liquid crystal panel, so that a relatively small stress is generated on the curved display panel, and the problem of serious peripheral light leakage caused by deformation of the curved display panel is alleviated. Besides, since the curvature radius of each point on the continuously curved surface changes slowly, the problem of serious peripheral light leakage caused by deformation of the curved display panel is alleviated, the complexity of the fabricating process is reduced, the fabricating process is simplified, and the production of the product is improved.

DETAILED DESCRIPTION OF THE INVENTION

The curved display panel, the curved display device and the method for fabricating the same of the present disclosure will be elucidated hereinafter in details with reference to the accompanying drawings and embodiments, so that technical solutions of the present disclosure will be understood by a skilled in the art.

Figure 1:
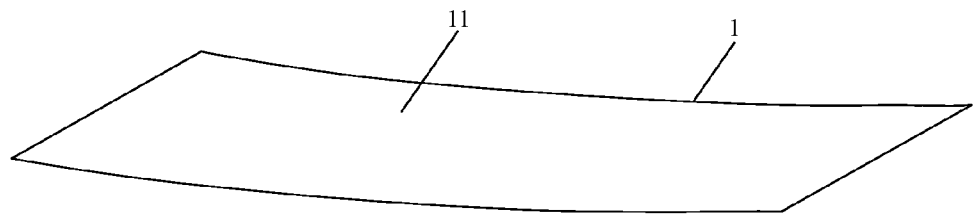
FIG. 1 is a structural view for illustrating a curved display panel in a first embodiment of the present disclosure.

FIG. 1 is a structural view for a curved display panel in a first embodiment of the present disclosure. As shown in FIG. 1, the curved display panel 1 has a light output face and a light input face, both of which are continuously curved surfaces 11.

In the present embodiment, the curved surfaces 11 have a bending shape of an elliptic curve. It is understood that "the curved surfaces 11 have a bending shape of an elliptic curve" in this context refers to a case in which, for example, when the curved surfaces 11 are arranged horizontally (as shown in FIG. 1), an intersecting line between the curved surfaces and a vertical plane which is parallel with the page is an elliptic curve. Additionally, when the elliptic curve is turned upside down, it is shown by an elliptic curve 41 in FIG. 2.

A curvature radius of the elliptic curve can be set according to requirements of the product. In the present embodiment, the curvature radius of the elliptic curve can preferably be 4200 mm-6600 mm.

In the present embodiment, the elliptic curve has a mathematical formula of $x^2/a^2+y^2/b^2=1$, wherein a and b are constants. That constants a and b can be set by mathematical fitting according to a preset curvature radius. For example, in case the preset curvature radius is 6000 mm, it is derived by mathematical fitting that a can be 730, and b can be 6012. Namely, in case the preset curvature radius is 6000 mm, the elliptic curve has a formula of $x^2/730^2+y^2/6012^2=1$, which is obtained by mathematical fitting. In practical applications, the mathematical fitting can be realized by existing software like EXCEL. In addition, an arc chord length (i.e., a length of a segment connecting two endpoints of the arc) of the elliptic curve can be set according to product type. For example, in the present embodiment, the elliptic curve has an arc chord length of 1460 mm.

Figure 2:
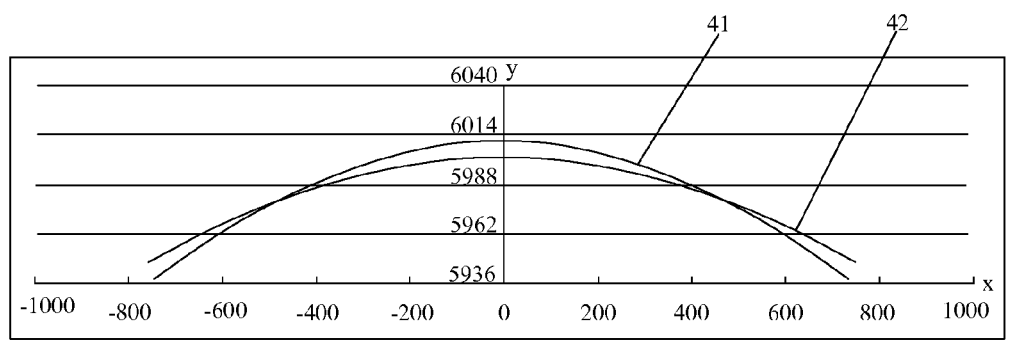
FIG. 2 is a fitting diagram for an elliptic curve of the curved display panel shown in FIG. 1.

FIG. 2 is a fitting diagram of the elliptic curve of the curved display panel shown in FIG. 1. As shown in FIG. 2, a curve 42 for the shape of a light output face and a light input face of a curved display panel in the prior art is also shown in FIG. 2, for the purpose of providing a clear comparison with the elliptic curve 41 for the shape of the light output face and the light input face of the curved display panel in the present embodiment. Both the elliptic curve 41 and the curve 42 in FIG. 2 are obtained by fitting according to the respective mathematical formula. In this case, the elliptic curve 41 is obtained by fitting according to the mathematical formula of $x^2/730^2+y^2/6012^2=1$. In the x-y coordinate system, both x coordinate axis and y coordinate axis have the units of mm. The elliptic curve 41 shown in FIG. 2 has a bending degree which is closer to the natural bending degree of the curved display panel 1. Thus, a relatively small stress is generated on the curved display panel 1 in the present embodiment, and the problem of serious peripheral light leakage caused by deformation of the curved display panel is alleviated. In addition, in FIG. 2, the curvature radius of each point on a curve which is obtained by fitting according to the above-mentioned mathematical formula changes slowly. As a result, the problem of peripheral light leakage in the curved display panel is alleviated to a certain extent.

In the technical solution for the curved display panel of the present embodiment, both the light output face and the light input face of the curved display panel are continuously curved surfaces. The curved display panel with a continuously curved surface has a bending degree which is closer to the natural bending degree of a liquid crystal panel, so that a relatively smaller stress is generated on the curved display panel, and the problem of serious peripheral light leakage caused by deformation of the curved display panel is alleviated. Additionally, since the curvature radius of each point on the continuously curved surface changes slowly, the problem of serious peripheral light leakage caused by deformation of the curved display panel is alleviated, the complexity of the fabricating process is reduced, the fabricating process is simplified, and the production of the product is improved. As compared with a technical solution in the prior art in which the curved display panel has a multiple-section curved surface, the curved display panel of the present embodiment poses a relatively low requirement on process accuracy, so that it is easy to fabricate. In the present embodiment, the curved display panel has a curved surface which is continuous, so that the curved display panel will have a better viewing angle.

Figure 3:
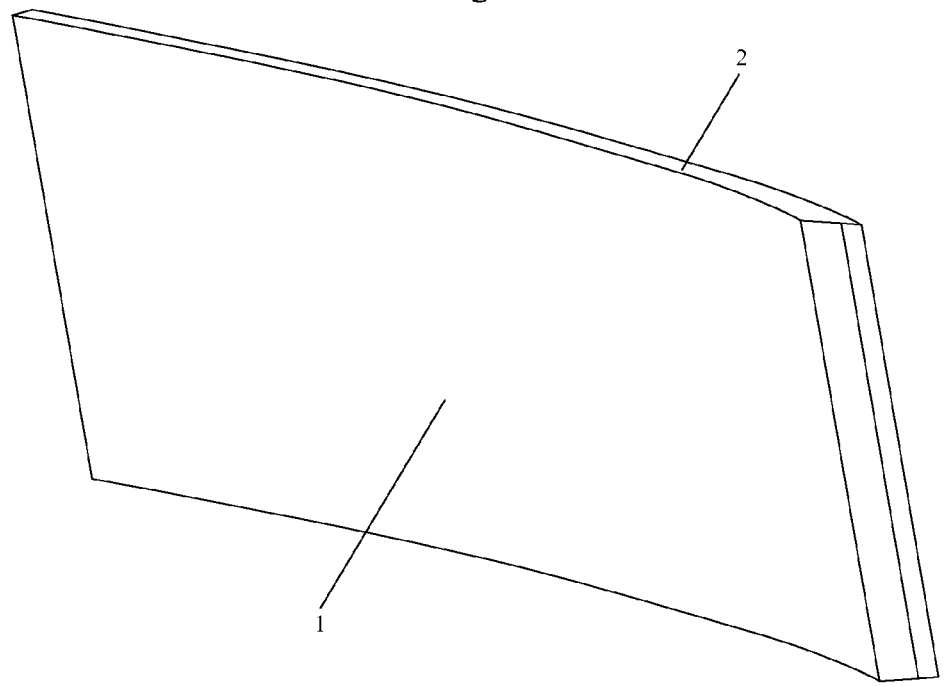
FIG. 3 is a structural view for illustrating a curved display device in a second embodiment of the present disclosure.
Figure 4:
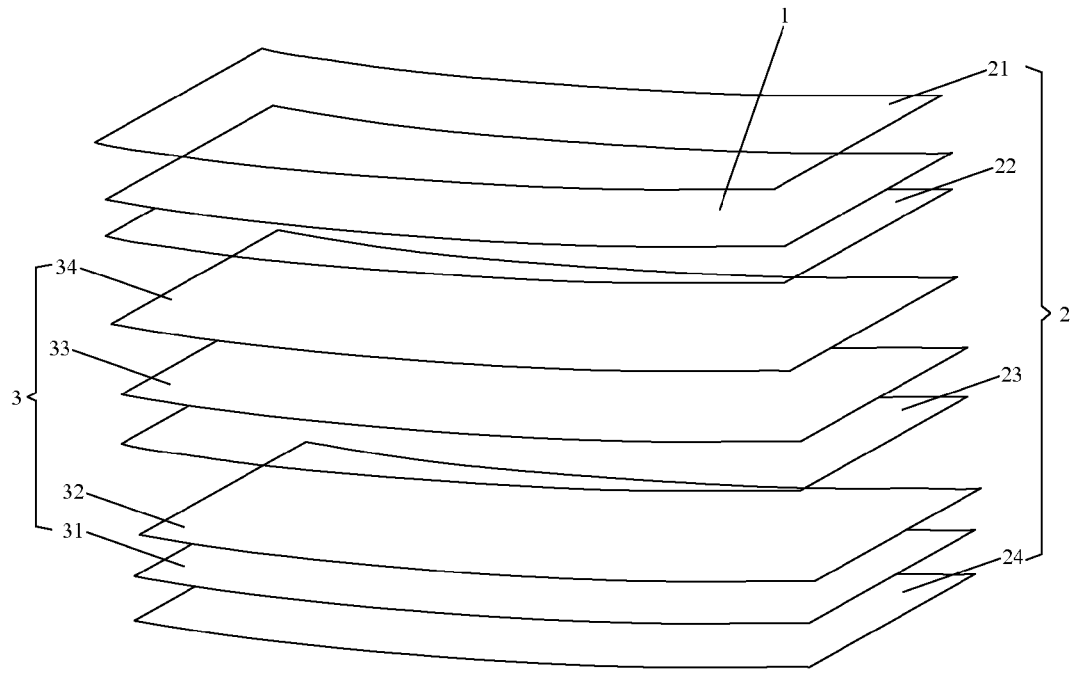
FIG. 4 is an assembled view of the curved display device shown in FIG. 3.

FIG. 3 is a structural view for a curved display device in a second embodiment of the present disclosure, and FIG. 4 is an assembled view of the curved display device shown in FIG. 3. As shown in FIG. 3 and FIG. 4, the curved display device comprises an assembling frame 2 and the curved display panel 1 which is arranged in the assembling frame 2.

As shown in the figures, in the present embodiment, the assembling frame 2 comprises a bezel 21, a mold frame 22, a side mold frame 23, and a back cover 24. The curved display panel 1 can be mounted between the bezel 21 and the mold frame 22, and the back cover 24 acts as a back cover for the whole curved display device. The bezel 21, the mold frame 22, the side mold frame 23, and the back cover 24 have a light output face and a light input face, both of which are continuously curved surfaces and have a bending shape of an elliptic curve. The curved surfaces of the bezel 21, the mold frame 22, the side mold frame 23, and the back cover 24 can have a bending shape identical with that of the curved surface of the curved display panel 1. Thus, as for description for the bending shape of the curved surfaces of the bezel 21, the mold frame 22, the side mold frame 23, and the back cover 24, reference can be made to the description for the bending shape of the light output face and the light input face of the curved display panel 1 in the first embodiment.

Further, the display device further comprises a display module 3. The display module 3 has a light output face and a light input face, both of which are continuously curved surfaces and have a bending shape of an elliptic curve. The display module 3 is arranged in the assembling frame 2 and at a light input side of the curved display panel 1. The display module 3 comprises a reflector sheet 31, a light bar 32, a diffuser plate 33, and optical films 34 which are arranged sequentially. In particular, the reflector sheet 31, the light bar 32, the diffuser plate 33, and the optical films 34 have a light output face and a light input face, both of which are continuously curved surfaces and have a bending shape of an elliptic curve (preferably the elliptic curve as mentioned above).

The side mold frame 23 can be configured to support the diffuser plate 33.

In the present embodiment, preferably, the curved display device can be an ADS display device.

In the present embodiment, reference can be made to the first embodiment for description of the curved display panel 1, which is not repeated for simplicity.

In the technical solution for the curved display device of the present embodiment, both the light output face and the light input face of the curved display panel are continuously curved surfaces. The curved display panel with a continuously curved surface has a bending degree which is closer to the natural bending degree of a liquid crystal panel, so that a relatively small stress is generated on the curved display panel, and the problem of serious peripheral light leakage caused by deformation of the curved display panel is alleviated. Additionally, since the curvature radius of each point on the continuously curved surface changes slowly, the problem of serious peripheral light leakage caused by deformation of the curved display panel is alleviated, the complexity of the fabricating process is reduced, the fabricating process is simplified, and the production of the product is improved. As compared with a technical solution in the prior art in which the curved display panel has a multiple-section curved surface, the curved display panel of the present embodiment poses a relatively low requirement on process accuracy, so that it is easy to fabricate. In the present embodiment, the curved display panel has a curved surface which is continuous, so that the curved display panel will have a better viewing angle.

Figure 5:
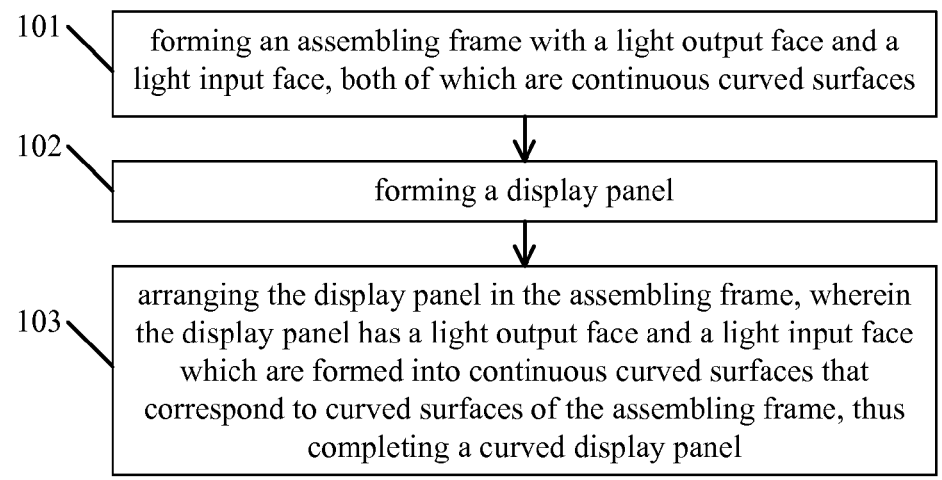
FIG. 5 is a flow chart for illustrating a method for fabricating a curved display device in a third embodiment of the present disclosure.

FIG. 5 is a flow chart of a method for fabricating a curved display device in a third embodiment of the present disclosure. As shown in FIG. 5, the curved display device comprises an assembling frame and a curved display panel. The method comprises the following steps.

At step 101, an assembling frame is formed, both a light output face and a light input face of which are continuously curved surfaces.

In the present embodiment, the assembling frame comprises a bezel, a mold frame, a side mold frame, and a back cover. The bezel, the mold frame, the side mold frame, and the back cover have a light output face and a light input face, both of which are continuously curved surfaces. Step 101 can particularly comprise forming the bezel, the mold frame, the side mold frame, and the back cover respectively, wherein the bezel, the mold frame, the side mold frame, and the back cover have a light output face and a light input face, both of which are continuously curved surfaces.

In the present embodiment, the curved surfaces have a bending shape of an elliptic curve.

At step 102, a display panel is formed. At this time, the display panel is not bent and still has a planar shape.

At step 103, the display panel is arranged in the assembling frame, and an external force is applied, so that the light output face and the light input face of the display panel are formed into continuously curved surfaces which correspond to the curved surface of the assembling frame, thus completing a curved display panel.

Since the curved display panel comprises a relatively soft material, in the case where the curved display panel is arranged in the assembling frame, due to the application of the external force, the curved display panel is bent under the action of the assembling frame, so that both the light output face and the light input face of the curved display panel are continuously curved surfaces. In the present embodiment, the curved surfaces have a bending shape of an elliptic curve.

In the present embodiment, the elliptic curve has a mathematical formula of $x^2/a^2+y^2/b^2=1$, wherein a and b are constants. The constants a and b can be set by mathematical fitting according to a preset curvature radius. For example, in case the preset curvature radius is 6000 mm, it is derived by mathematical fitting that a can be 730, and b can be 6012. Namely, in a case where the preset curvature radius is 6000 mm, it is derived by mathematical fitting that the elliptic curve has a formula of $x^2/730^2+y^2/6012^2=1$. In practical applications, the mathematical fitting can be realized by existing software like EXCEL. In addition, an arc chord length of the elliptic curve can be set according to product type. For example, in the present embodiment, the elliptic curve has an arc chord length of 1460 mm.

Further, the curved display device can further comprise a display module, and the method can further comprise the following steps.

At step 104, a display module is formed. The specific structures are similar to the second embodiment and are therefore repeated here.

At step 105, the display module is arranged in an assembling frame, so that the display module has a light output face and a light input face, both of which are continuously curved surfaces.

Since the display module comprises a relatively soft material, in the case where the display module is arranged in the assembling frame, due to the application of an external force, the display module is bent under an action of the assembling frame, so that both the light output face and the light input face of the display module are continuously curved surfaces. In particular, as for each component in the display module, both the light output face and the light input face are continuously curved surfaces.

The present embodiment presents a sequence for performing steps, while in practical applications these steps can be performed in other sequences as required.

In the technical solution for the curved display device fabricated by the method of the present embodiment, both the light output face and the light input face of the curved display panel are continuously curved surfaces. The curved display panel with a continuously curved surface has a bending degree which is closer to the natural bending degree of a liquid crystal panel, so that a relatively small stress is generated on the curved display panel, and the problem of serious peripheral light leakage caused by deformation of the curved display panel is alleviated. Besides, since the curvature radius of each point on the continuously curved surface changes slowly, the problem of serious peripheral light leakage caused by deformation of the curved display panel is alleviated, the complexity of the fabricating process is reduced, the fabricating process is simplified, and the production of the product is improved. As compared with a technical solution in the prior art in which the curved display panel has a multiple-section curved surface, the curved display panel of the present embodiment poses a relatively low requirement on process accuracy, so that it is easy to fabricate. In the present embodiment, the curved display panel has a curved surface which is continuous, so that the curved display panel will have a better viewing angle.

Although the present disclosure has been described above with reference to specific embodiments, it should be understood that the limitations of the described embodiments are merely for illustrative purpose and by no means limiting. Instead, the scope of the disclosure is defined by the appended claims rather than by the description, and all variations that fall within the range of the claims are intended to be embraced therein. Thus, other embodiments than the specific ones described above are equally possible within the scope of these appended claims.

What is claimed is:

1. A curved display panel, wherein said curved display panel has a light output face and a light input face, and both said light output face and said light input face are continuously curved surfaces, said curved surfaces have a bending shape of an elliptic curve, said elliptic curve has a mathematical formula of $x^2/a^2+y^2/b^2=1$, wherein a, b are constants which are different from each other, and wherein said elliptic curve has a curvature radius in a range of 4200 mm-6600 mm.

2. The curved display panel of claim 1, wherein a, b are set by mathematical fitting according to a preset curvature radius.

3. The curved display panel of claim 2, wherein a=730 and b=6012.

4. The curved display panel of claim 3, wherein said elliptic curve has a curvature radius of 6000 mm.

5. The curved display panel of claim 3, wherein said elliptic curve has an elliptic arc length of 1460 mm.

6. A curved display device, wherein said curved display device comprises an assembling frame and the curved display panel of claim 1 which is arranged in said assembling frame.

7. The curved display device of claim 6, wherein said assembling frame comprises a bezel, a mold frame, a side mold frame, and a back cover,
wherein said bezel and said mold frame are configured to mount said curved display panel, said side mold frame is configured to support a diffuser plate of a display module of said curved display device, and said back cover is configured as a back cover of said curved display device, and
wherein said bezel, said mold frame, said side mold frame, and said back cover have a light output face and a light input face, both of which are continuously curved surfaces.

8. A method for fabricating a curved display device, wherein the method comprises steps of:
forming an assembling frame with a light output face and a light input face, both of which are continuously curved surfaces;
forming a display panel;
arranging said display panel in said assembling frame, wherein said display panel has a light output face and a light input face which are formed into continuously curved surfaces that correspond to curved surfaces of said assembling frame, thus completing a curved display panel, wherein said curved surfaces have a bending shape of an elliptic curve, said elliptic curve has a mathematical formula of $x^2/a^2+y^2/b^2=1$, wherein a, b are constants which are different from each other, and wherein said elliptic curve has a curvature radius in a range of 4200 mm-6600 mm.

9. The method of claim 8, wherein said assembling frame comprises a bezel, a mold frame, a side mold frame, and a back cover, wherein said bezel, said mold frame, said side mold frame, and said back cover have a light output face and a light input face, both of which are continuously curved surfaces.

* * * * *